(12) United States Patent
Yao et al.

(10) Patent No.: US 11,056,399 B2
(45) Date of Patent: Jul. 6, 2021

(54) SOURCE AND DRAIN EPI PROTECTIVE SPACER DURING SINGLE DIFFUSION BREAK FORMATION

(71) Applicant: INTERNATIONAL BUSINESS MACHINES CORPORATION, Armonk, NY (US)

(72) Inventors: Yao Yao, Albany, NY (US); Andrew M. Greene, Slingerlands, NY (US); Veeraraghavan S. Basker, Schenectady, NY (US); Kangguo Cheng, Schenectady, NY (US); Zhenxing Bi, Niskayuna, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 16/380,487

(22) Filed: Apr. 10, 2019

(65) Prior Publication Data

US 2020/0328121 A1    Oct. 15, 2020

(51) Int. Cl.
*H01L 21/8234* (2006.01)
*H01L 21/762* (2006.01)
(Continued)

(52) U.S. Cl.
CPC ........... *H01L 21/823481* (2013.01); *H01L 21/823418* (2013.01); *H01L 21/823431* (2013.01);
(Continued)

(58) Field of Classification Search
CPC ....... H01L 21/76224; H01L 21/823431; H01L 21/823481; H01L 21/823418;
(Continued)

(56) References Cited

U.S. PATENT DOCUMENTS 6,268,637 B1    7/2001  Gardner et al.
7,435,683 B2   10/2008  Kavalieros et al.
(Continued)

FOREIGN PATENT DOCUMENTS

CN    108281362 A    7/2018

OTHER PUBLICATIONS

Cheng, "(Invited) FinFET Technology", ECS Transactions. vol. 80. No. 4. Aug. 1, 2017. pp. 17-31.
(Continued)

*Primary Examiner* — Zandra V Smith
*Assistant Examiner* — Jeremy J Joy
(74) *Attorney, Agent, or Firm* — Tutunjian & Bitetto, P.C.; Erik Johnson (57) ABSTRACT

A method is presented for forming single diffusion break (SDB) without damaging source and drain epitaxial growth regions. The method includes forming the source and drain epitaxial regions between sacrificial gates, the sacrificial gates formed over a plurality of fins, depositing an interlayer dielectric (ILD) over the source and drain epitaxial regions, performing SDB patterning, and removing at least one of the sacrificial gates to expose the plurality of fins. The method further includes recessing the plurality of fins to create a first opening, forming inner spacers within the opening, removing the plurality of fins to create a second opening, dimensions of the second opening defined by the inner spacers, and laterally etching the second opening to increase SDB width.

20 Claims, 10 Drawing Sheets

(51) Int. Cl.
  *H01L 27/088* (2006.01)
  *H01L 29/06* (2006.01)
  *H01L 29/66* (2006.01)
  *H01L 29/78* (2006.01)
(52) U.S. Cl.
  CPC ...... *H01L 27/0886* (2013.01); *H01L 29/0649* (2013.01); *H01L 29/66545* (2013.01); *H01L 29/66795* (2013.01); *H01L 29/785* (2013.01)
(58) Field of Classification Search
  CPC ......... H01L 21/823468; H01L 27/0886; H01L 29/785; H01L 29/66795; H01L 29/66545; H01L 29/0649–0653
  See application file for complete search history.

(56) References Cited

U.S. PATENT DOCUMENTS

| | | | |
|---|---|---|---|
| 8,716,090 B2 | 5/2014 | Qin et al. | |
| 9,123,773 B1* | 9/2015 | Shen | H01L 21/76232 |
| 9,171,752 B1 | 10/2015 | Wu et al. | |
| 9,281,382 B2 | 3/2016 | Liu et al. | |
| 9,368,496 B1* | 6/2016 | Yu | H01L 29/16 |
| 9,412,616 B1 | 8/2016 | Xie et al. | |
| 9,496,342 B2 | 11/2016 | Yin | |
| 9,589,845 B1* | 3/2017 | Jagannathan | H01L 29/7851 |
| 9,653,583 B1* | 5/2017 | Zhao | H01L 29/66795 |
| 9,660,022 B2 | 5/2017 | Liou et al. | |
| 9,917,103 B1 | 3/2018 | Mulfinger et al. | |
| 10,090,382 B1 | 10/2018 | Yu et al. | |
| 10,510,749 B1* | 12/2019 | Zang | H01L 21/823481 |
| 2016/0163604 A1* | 6/2016 | Xie | H01L 27/0924 257/401 |
| 2016/0190130 A1* | 6/2016 | Yu | H01L 21/823431 257/401 |
| 2016/0225762 A1 | 8/2016 | Zang et al. | |
| 2017/0053980 A1* | 2/2017 | Liou | H01L 29/0649 |
| 2017/0243790 A1* | 8/2017 | Xie | H01L 21/31051 |
| 2018/0261596 A1* | 9/2018 | Jun | H01L 21/823475 |
| 2018/0308742 A1* | 10/2018 | Cheng | H01L 29/66666 |
| 2018/0358450 A1* | 12/2018 | Kim | H01L 21/823431 |
| 2019/0139831 A1* | 5/2019 | Zhu | H01L 21/762 |
| 2019/0172753 A1* | 6/2019 | Lin | H01L 21/764 |
| 2020/0176444 A1* | 6/2020 | Xu | H01L 29/66545 |

OTHER PUBLICATIONS

Chew et al, "Replacement Metal Contact Using Sacrificial ILD0 for Wrap Around Contact in Scaled FinFET Technology", 2018 IEEE International Interconnect Technology Conference (IITC). Jun. 4, 2018. pp. 33-35.

* cited by examiner

SOURCE AND DRAIN EPI PROTECTIVE SPACER DURING SINGLE DIFFUSION BREAK FORMATION

BACKGROUND

The present invention relates generally to semiconductor devices, and more specifically, to source and drain epitaxial growth protective inner spacers constructed during single diffusion break formation.

Various transistor devices that are formed for an integrated circuit (IC) product must be electrically isolated from one another to properly function in an electrical circuit. Usually, this is accomplished by forming a trench in a substrate and filling the trench with an insulating material, such as silicon dioxide. Within the industry, these isolation regions can sometimes be referred to as "diffusion breaks." However, the formation of such isolation structures consumes very valuable plot space on the substrate. Moreover, in some applications, such as those IC products employing fin field effect transistors (FinFETs), as device sizes have decreased, and packing densities have increased, it is sometimes difficult to form the desired isolation region made of an insulating material.

SUMMARY

In accordance with an embodiment, a method is provided for forming single diffusion break (SDB) without damaging source and drain epitaxial growth regions. The method includes forming the source and drain epitaxial regions between sacrificial gates, the sacrificial gates formed over a plurality of fins, depositing an interlayer dielectric (ILD) over the source and drain epitaxial regions, performing SDB patterning, removing at least one of the sacrificial gates to expose the plurality of fins, recessing the plurality of fins to create a first opening, forming inner spacers within the opening, removing the plurality of fins to create a second opening, dimensions of the second opening defined by the inner spacers, and laterally etching the second opening to increase SDB width.

In accordance with another embodiment, a method is provided for forming single diffusion break (SDB) without damaging source and drain epitaxial growth regions. The method includes forming the source and drain epitaxial regions between sacrificial gates, the sacrificial gates formed over a plurality of fins, performing SDB patterning, removing at least one of the sacrificial gates to expose the plurality of fins, anisotropically etching the plurality of fins to create a first opening, forming inner spacers within the opening, removing the plurality of fins to create a second opening, and isotropically etching the second opening in a lateral direction with respect to the source and drain epitaxial growth regions to increase SDB width.

In accordance with yet another embodiment, a semiconductor structure is provided for forming single diffusion break (SDB) without damaging source and drain epitaxial growth regions. The semiconductor structure includes the source and drain epitaxial regions disposed in direct contact with a substrate, a conductive material disposed over the source and drain epitaxial regions, inner spacers disposed between source and drain epitaxial regions, a dielectric material disposed between the inner spacers, and an air gap defined within a distal end of the dielectric material.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for employing inner spacers for protecting source and drain epitaxial growths, for increasing a width of the single diffusion break (SDB), and decreasing parasitic capacitance. By employing an SDB spacer selective to a silicon (Si) etch, which acts as a Si etch stop layer, the SDB spacer protects the source and drain epitaxial regions during Si etch in SDB formation.

With constant down-scaling and increasingly demanding requirements to the speed and functionality of ultra-high density integrated circuits, semiconductor devices, such as transistors, diodes, capacitors and the like, need to continuously reduce space between active (Rx) regions on a semiconductor substrate. More specifically, as integrated circuits are scaled down, the shallow trench isolation (STI) regions used to electrically isolate Rx regions must also be scaled down.

Conventionally, multiple Rx regions in a semiconductor integrated circuit usually include arrays of parallel extending fins having distal ends abutting the edges of each Rx region. By way of example, this is particularly the case for FinFET technology at the 14 nm node and beyond. The fin arrays are terminated by dummy gates, which extend laterally across the distal ends of the fins at the edges of the Rx regions. The dummy gates are used to induce symmetrical epitaxial growth of source/drain regions (S/D regions) on the end portions of the fins located between the dummy gates and adjacent active gates.

Also conventionally, the multiple Rx regions are separated by isolation regions, such as STI regions, that usually include an amorphous dielectric material, such as a flowable oxide (FOX), and have a width of about 70 to 80 nanometers (nm). There can be many thousands to millions of such isolation regions providing electrical isolation between the many Rx regions in an ultra-high density integrated circuit.

However, as integrated circuits are scaled down to such class sizes as 14 nm node or beyond, the width of a conventional isolation region becomes increasingly problematic as a region devoid of active devices. Therefore, in an effort to reduce the width of conventional isolation regions, single dummy gates disposed within such isolation regions that can terminate two opposing fin arrays (e.g., fin-ends to fin-ends) between adjacent Rx regions have been developed. These specially designed dummy gates on isolation structure are known as Single Diffusion Breaks (SDB) and reduce the distance between Rx regions, that is the distance between fin array edges or fin-ends, e.g., the width of an isolation region, to about 30 nm.

However the formation of conventional SDBs problematically need extra masking, deposition and etching steps. Additionally, the process of making such SDBs are sensitive to lithographic alignment tolerances, which limit their scalability. Moreover, the structure of conventional SDBs limits the epitaxial growth of the S/D regions abutting the SDB, resulting in S/D regions having a smaller epitaxial volume and electrical contact area compared to that of S/D regions located between active gates. The smaller S/D region volume and contact area can lead to greater contact resistance and degrade device performance. Embodiments in accordance with the present invention provide methods and devices for increasing the SDB width, thus decreasing parasitic capacitance and device leakage. An air gap in the SDB allows for the reduction in the parasitic capacitance. Moreover, the SDB spacers or inner spacers allow for an aggressive isotropic etch to increase SDB width without damaging the source and drain epitaxial regions.

Examples of semiconductor materials that can be employed in forming such structures include silicon (Si), germanium (Ge), silicon germanium alloys (SiGe), carbon doped silicon (Si:C), carbon doped silicon germanium carbide (SiGe:C), phosphorous doped silicon (Si:P), boride doped silicon germanium (SiGe:B), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
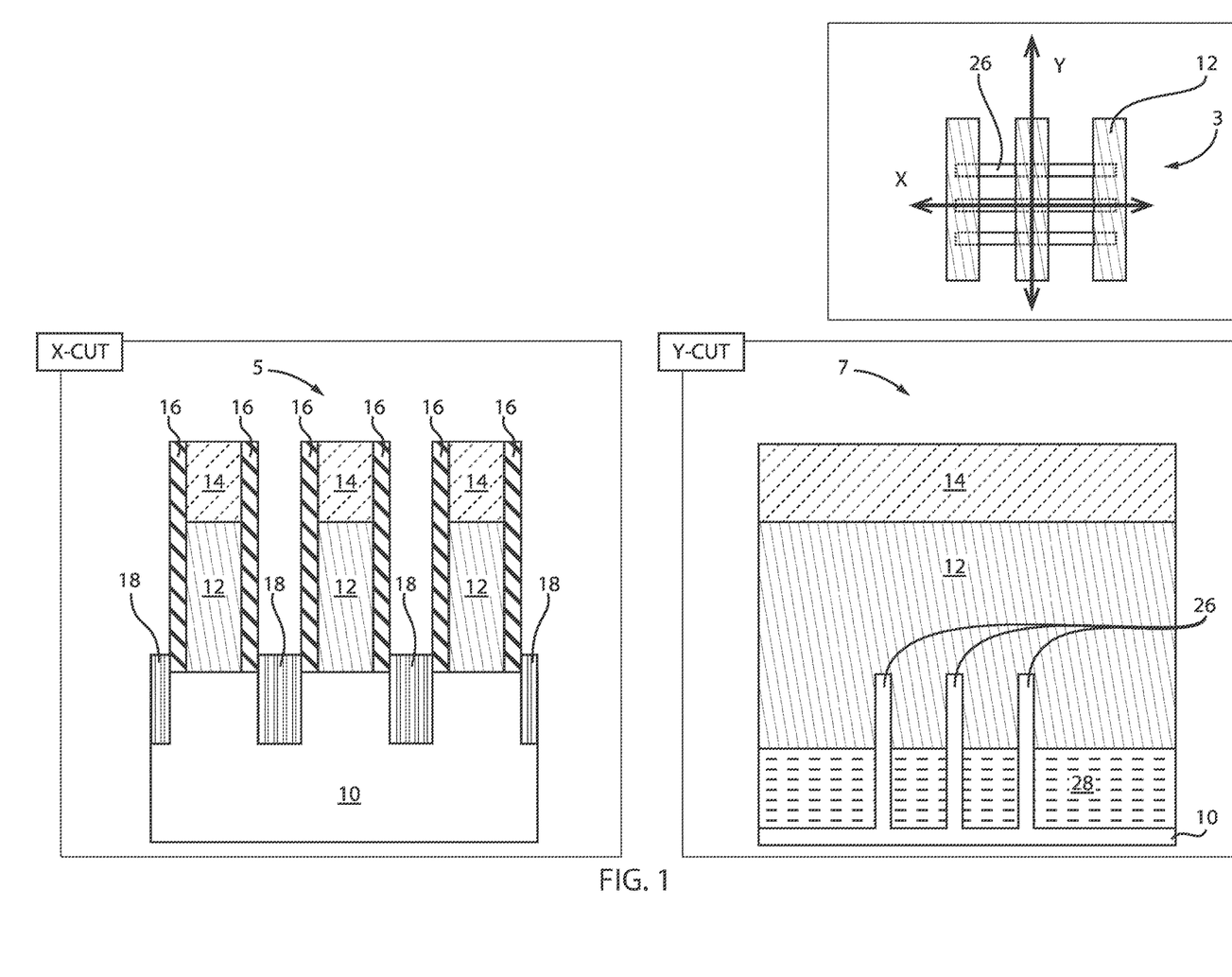
FIG. 1 is a cross-sectional view of a semiconductor structure including dummy gates formed between spacers and over a substrate, the semiconductor structure including source and drain epitaxial growth regions, in accordance with an embodiment of the present invention.

FIG. 1 is a cross-sectional view of a semiconductor structure including dummy gates formed between spacers and over a substrate, the semiconductor structure including source and drain epitaxial growth regions, in accordance with an embodiment of the present invention.

In structures 5 and 7, a plurality of dummy gates 12 (or sacrificial gates 12) can be formed over a substrate 10. A hardmask 14 can be formed over and in direct contact with the dummy gates 12. Spacers 16 can be formed adjacent the dummy gates 12 and the hardmasks 14. Epitaxial growth regions 18 can be grown between the dummy gates 12. The epitaxial growth regions 18 extend into substrate 10.

Structure 5 is a cross-sectional view taken along line X of top view 3, whereas structure 7 is a cross-sectional view taken along line Y of top view 3.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), Si:C (carbon doped silicon), carbon doped silicon germanium (SiGe:C), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials.

Materials for the dummy gate 12 include, but are not limited to, any one or more of amorphous or polycrystalline Si, $SiO_2$, SiON, SiGe, Ge, $GeO_2$, amorphous C, BC, CN, etc. The hardmask 14 materials can include any of one or more of SiN, SiCN, SiBN and/or SiBCN, among other materials. Further, spacers 16 can include any of one or more of SiN, SiBN, SiCN and/or SiBCN films. STI regions 28 can be formed in the substrate 10 to electrically isolate regions of adjacent semiconductor devices that are formed over the substrate 10. STI regions 28 can include, e.g., oxide (referred to as STI oxide).

The fins 26 can be formed from a semiconductor material including, but not limited to Si, strained Si, Si:C, SiGe, SiGe:C, Si alloys, Ge, Ge alloys, GaAs, InAs, InP, as well as other III/V and II/VI compound semiconductors. The fins 26 can be etched by employing, e.g., a reactive ion etch (RIE) or the like. In other embodiments, the etching can include a dry etching process such as, for example, reactive ion etching, plasma etching, ion etching or laser ablation. The etching can further include a wet chemical etching process in which one or more chemical etchants are employed to remove portions of the layers.

Generally, epitaxial growth, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor material with sufficient energy to move around on the surface and orient themselves to the crystal arrangement of the atoms of the deposition surface. Therefore, an epitaxial material has the same crystalline characteristics as the deposition surface on which it is formed. For example, an epitaxial material deposited on a <100> crystal surface will take on a <100> orientation.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and can be conducted at higher or lower temperatures as needed.

Figure 2:
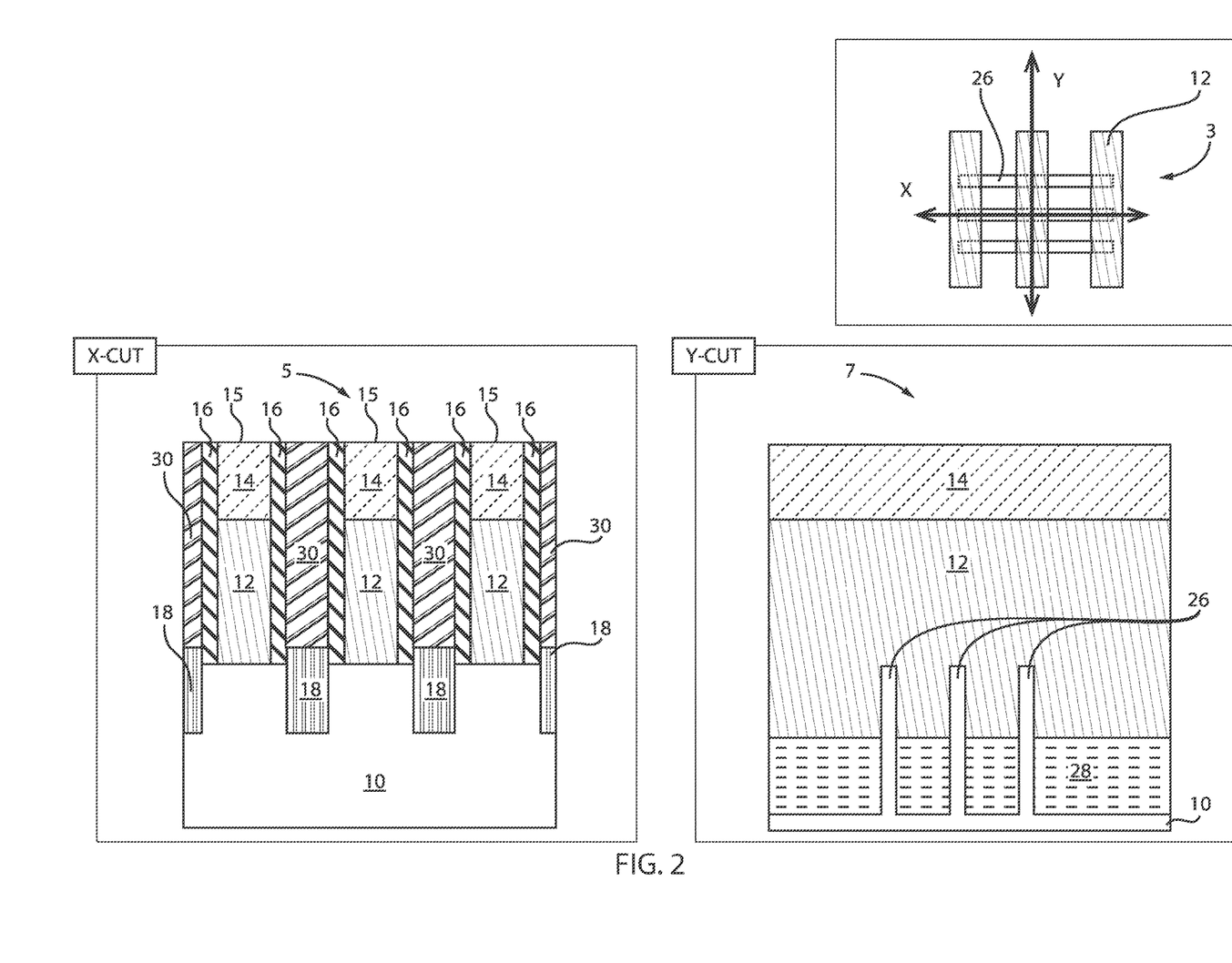
FIG. 2 is a cross-sectional view of the semiconductor structure of FIG. 1 where an interlayer dielectric (ILD) is deposited and chemical mechanical polishing (CMP) is performed, in accordance with an embodiment of the present invention.

FIG. 2 is a cross-sectional view of the semiconductor structure of FIG. 1 where an interlayer dielectric (ILD) is deposited and chemical mechanical polishing (CMP) is performed, in accordance with an embodiment of the present invention.

In various example embodiments, an interlayer dielectric (ILD) 30 is deposited over the epitaxial growth regions 18. The ILD 30 directly contacts the epitaxial growth regions 18. The ILD 30 can be planarized such that a top surface of the ILD 30 is level or flush with the top surface 15 of the hardmasks 14.

The ILD 30 can include any materials known in the art, such as, for example, porous silicates, carbon doped oxides, silicon dioxides, silicon nitrides, silicon oxynitrides, or other dielectric materials. The ILD 30 can be formed using any method known in the art, such as, for example, chemical vapor deposition, plasma enhanced chemical vapor deposition, atomic layer deposition, or physical vapor deposition.

The planarizing process can include chemical mechanical polishing (CMP) followed by an etch process. Therefore, the planarization process can be provided by CMP. Other planarization processes can include grinding and polishing.

Figure 3:
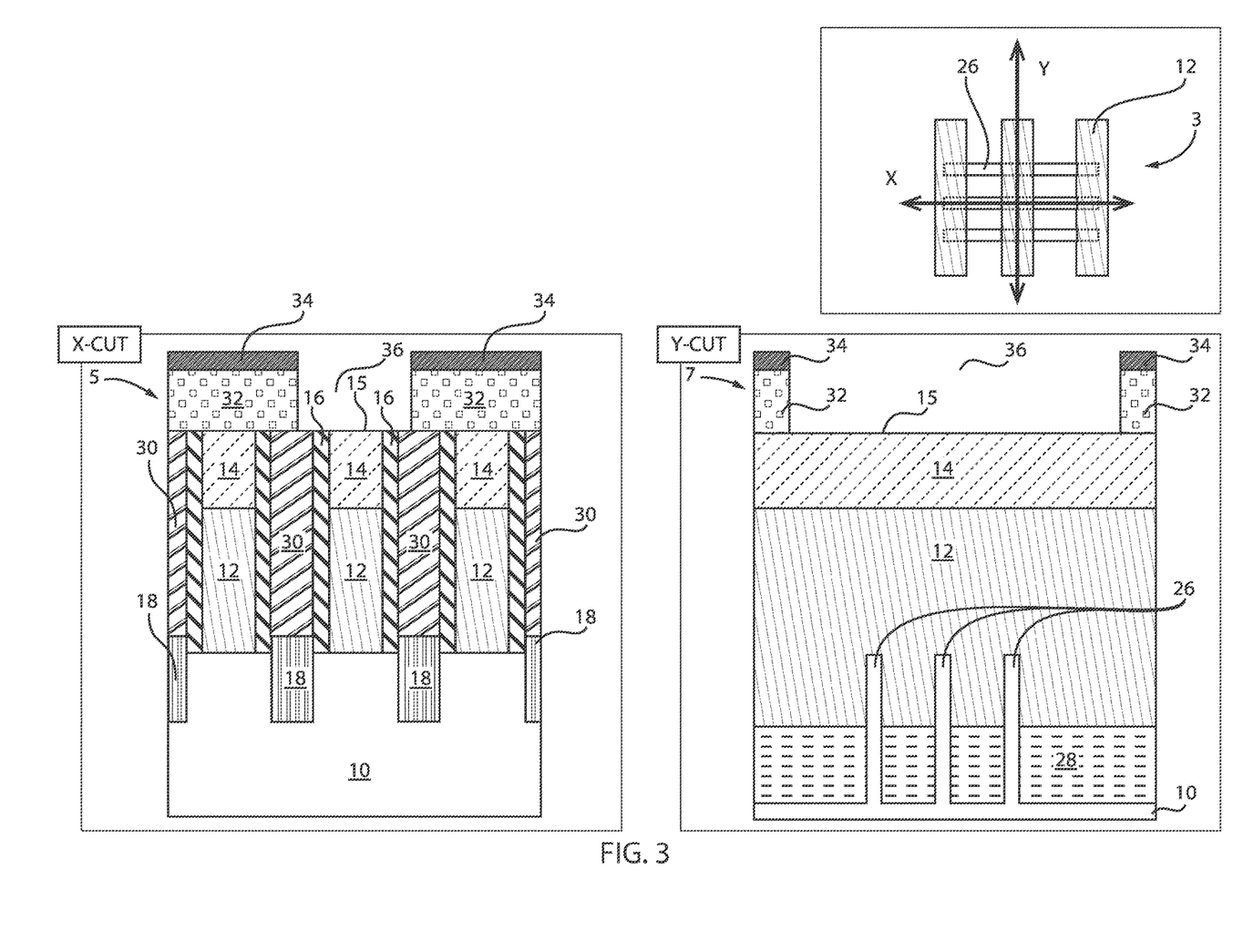
FIG. 3 is a cross-sectional view of the semiconductor structure of FIG. 2 where single diffusion break (SDB) patterning takes place, in accordance with an embodiment of the present invention.

FIG. 3 is a cross-sectional view of the semiconductor structure of FIG. 2 where single diffusion break (SDB) patterning takes place, in accordance with an embodiment of the present invention.

In various example embodiments, single diffusion break (SDB) patterning takes place. In particular, an organic planarization layer (OPL) 32 and an anti-reflective coating (ARC) layer 34 can be deposited.

The OPL layer 32 and the ARC layer 34 can be employed as a lithographic stack to pattern the underlying layers. The OPL layer 32 is formed at a predetermined thickness to provide reflectivity and topography control during etching of the hard mask layers below. The OPL layer 32 can include an organic material, such as a polymer. The thickness of the OPL 32 can be in a range from about 50 nm to about 300 nm.

The layer 34 is an ARC layer which minimizes the light reflection during lithography for a lithography stack. The ARC layer 34 can include silicon, for example, a silicon anti-reflective layer (SiARC). The thickness of the ARC layer 34 can be in range from about 10 nm to about 100 nm. The anti-reflective film layer 34 can be an antireflective layer for suppressing unintended light reflection during photolithography. Exemplary materials for an antireflective layer include, but are not limited to, metal silicon nitrides, or a polymer film. The anti-reflective layer can be formed, depending on materials, for example, using sputter deposition, chemical vapor deposition, or spin coating.

A photolithography process usually includes applying a layer of photoresist material (e.g., a material that will react when exposed to light), and then selectively exposing portions of the photoresist to light or other ionizing radiation (e.g., ultraviolet, electron beams, X-rays, etc.), thereby changing the solubility of portions of the material. The resist is then developed by washing the resist with a developer solution, such as, e.g., tetramethylammonium hydroxide (TMAH), thereby removing non-irradiated (in a negative resist) or irradiated (in a positive resist) portions of the resist layer.

The patterning results in opening 36 formed over a dummy gate 12. The top surface 15 of the hardmask 14 of such dummy gate 12 is thus exposed.

Figure 4:
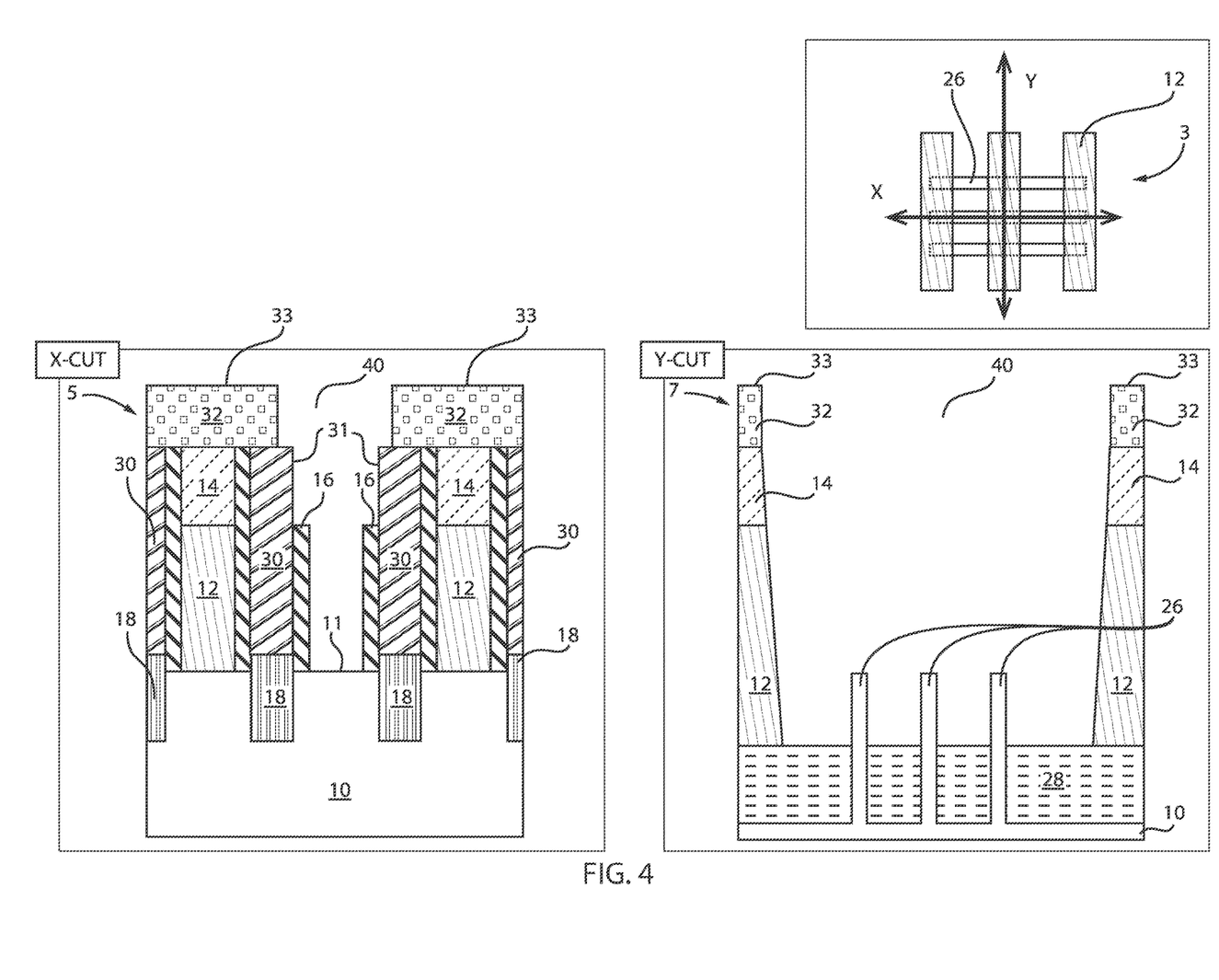
FIG. 4 is a cross-sectional view of the semiconductor structure of FIG. 3 where a dummy gate is removed, in accordance with an embodiment of the present invention.

FIG. 4 is a cross-sectional view of the semiconductor structure of FIG. 3 where a dummy gate is removed, in accordance with an embodiment of the present invention.

In various example embodiments, the exposed hardmask 14 and the exposed dummy gate 12 are removed thus creating opening 40. Additionally, a portion of the exposed spacers 16 is removed such that sidewalls 31 of the ILD 30 are exposed. Additionally, the ARC layer 34 is completely removed thus exposing a top surface 33 of the OPL 32. Opening 40 extends to a top surface 11 of the substrate 10.

In view Y, the fins 26 are now exposed.

Recessing can be performed by, e.g., dry etch processing. In one example, a dry etch can be employed, such as, but not limited to, a directional reactive ion etch (RIE) process with chemistry such as chlorine gas ($Cl_2$)+hydrogen bromide (HBr)+argon (Ar)+oxygen gas ($O_2$).

Figure 5:
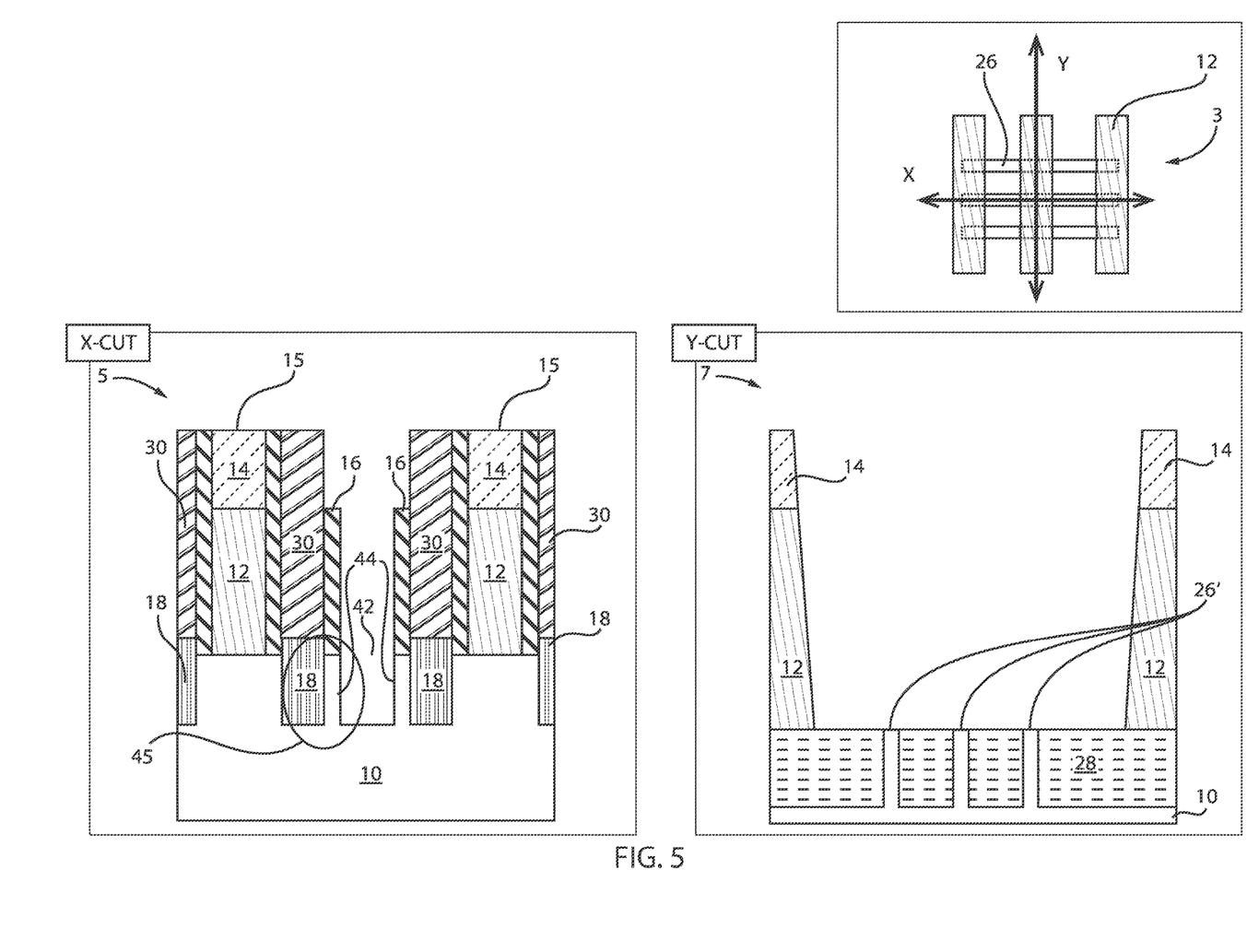
FIG. 5 is a cross-sectional view of the semiconductor structure of FIG. 4 where a first fin recess takes place without damaging the source and drain epitaxial growth regions, in accordance with an embodiment of the present invention.

FIG. 5 is a cross-sectional view of the semiconductor structure of FIG. 4 where a first fin recess takes place without damaging the source and drain epitaxial growth regions, in accordance with an embodiment of the present invention.

In various example embodiments, the fins are recessed thus resulting in fins 26' (view Y).

In view X, an opening 42 is formed in the substrate 10. The opening 42 does not damage the epitaxial growth regions 18 because portions 44 protect the epitaxial growth regions 18. Portions 44 can be referred to as substrate portions. This protection is shown in region 45. Additionally, the OPL 32 is completely removed thus exposing top surface 15 of the hardmask 14.

Therefore, since the selective Si etch is not performed aggressively, there is little lateral erosion. In other words, there is no damage to the neighboring epitaxial growth regions 18.

Figure 6:
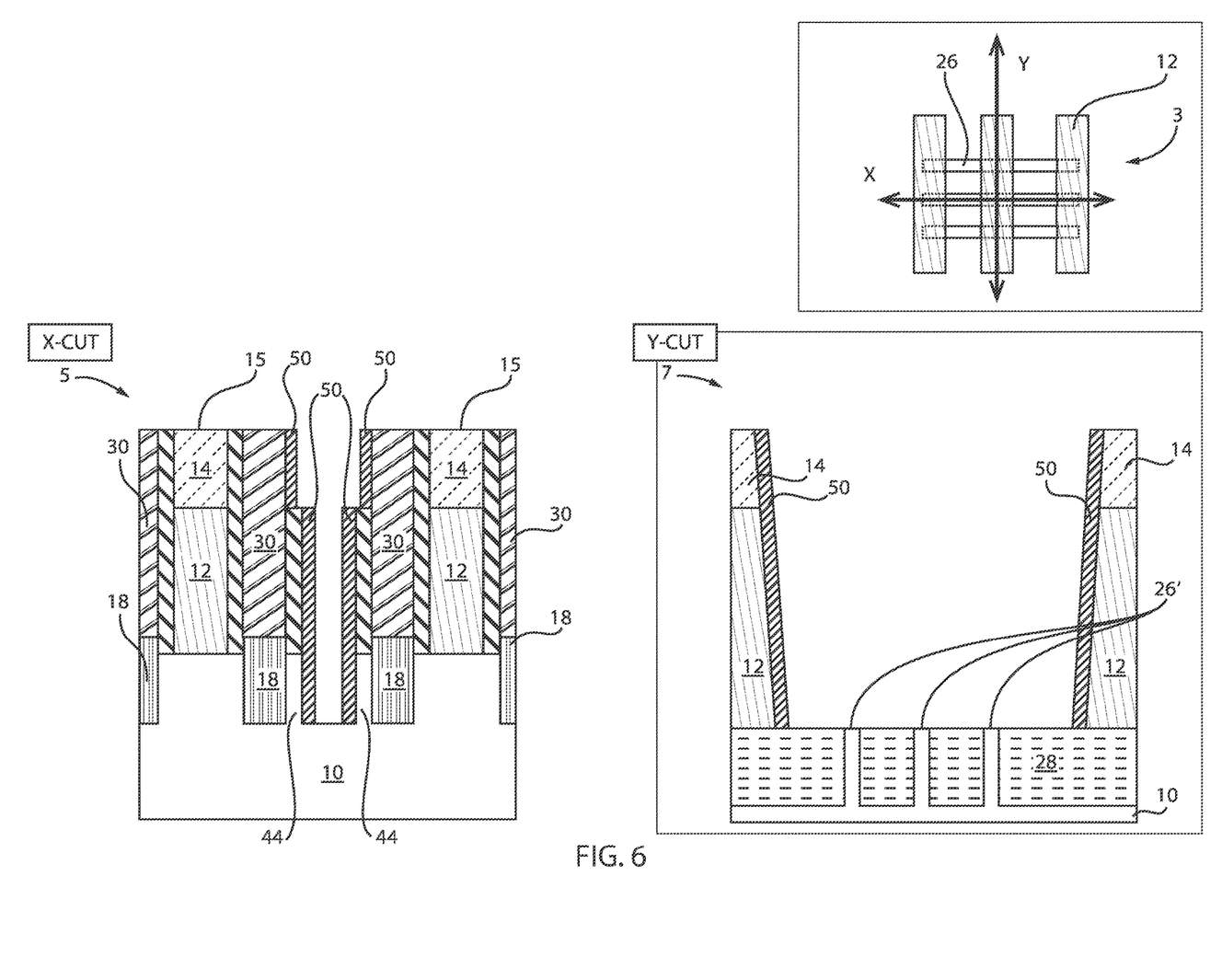
FIG. 6 is a cross-sectional view of the semiconductor structure of FIG. 5 where inner spacers are formed, in accordance with an embodiment of the present invention.

FIG. 6 is a cross-sectional view of the semiconductor structure of FIG. 5 where inner spacers are formed, in accordance with an embodiment of the present invention.

In various example embodiments, inner spacers 50 are formed adjacent the portions 44, adjacent the spacers 16, and adjacent the sidewalls 31 of the exposed portions of the ILD 30. The inner spacers 50 extend into the opening 42.

The inner spacers 50 can be, e.g., SiC, SiOC, SiOCN, SiCO, SiO$_2$, etc. The thickness of the inner spacers 50 can be less than the thickness of the spacers 16.

Figure 7:
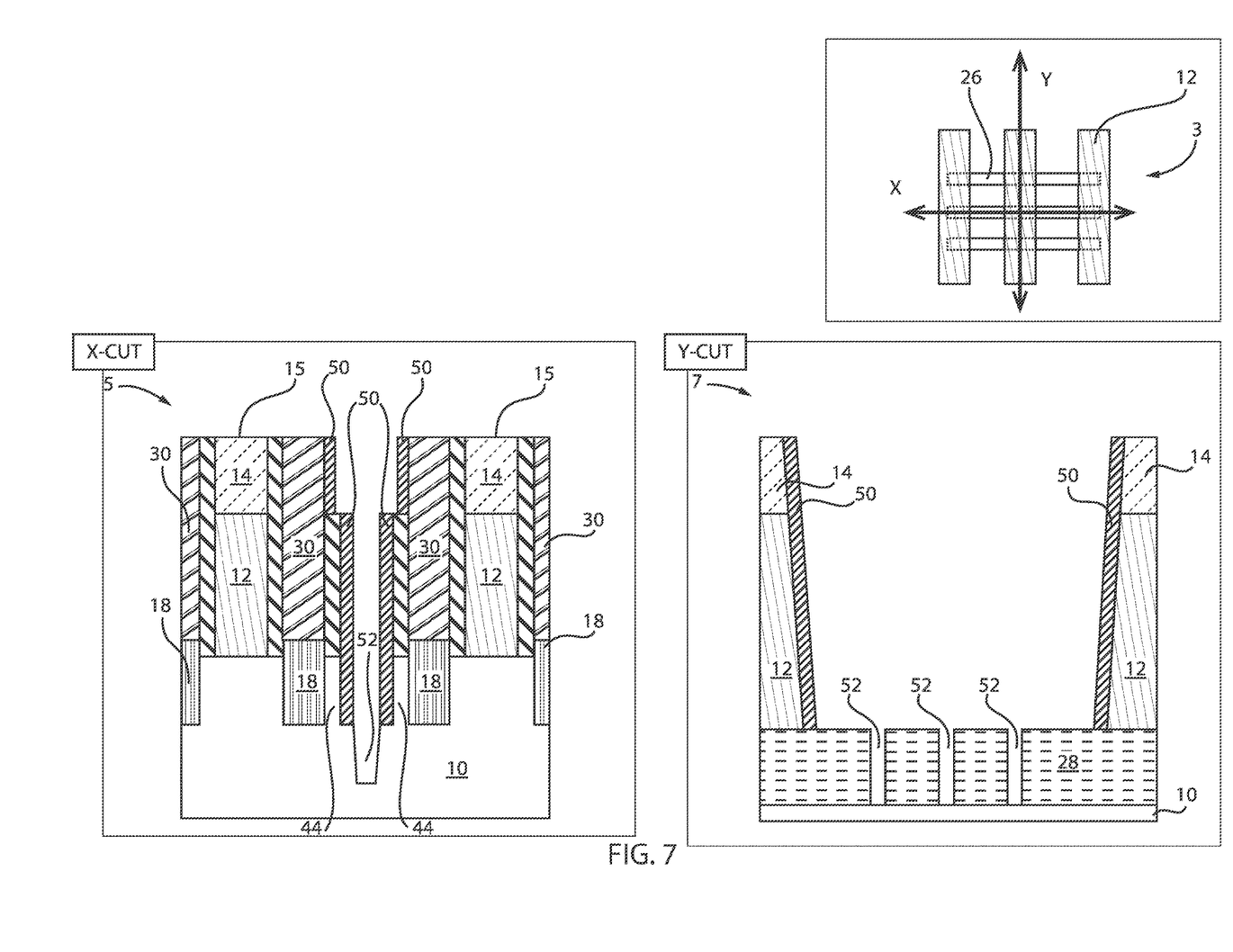
FIG. 7 is a cross-sectional view of the semiconductor structure of FIG. 6 where a second fin recess takes place and the inner spacers protect the source and drain epitaxial growth regions, in accordance with an embodiment of the present invention.

FIG. 7 is a cross-sectional view of the semiconductor structure of FIG. 6 where a second fin recess takes place and the inner spacers protect the source and drain epitaxial growth regions, in accordance with an embodiment of the present invention.

In various example embodiments, a second fin recess takes place thus creating opening 52. The inner spacers 50 protect the source and drain epitaxial growth regions 18. This etch is very selective to the Si, and thus etches or creates a small deep hole. Without using the inner spacer 50 for protection, it would be easy to cause epi damage. However, the inner spacers 50 aid in protecting the epitaxial growth regions 18 during the formation of opening 52. The opening 52 is narrower than the opening 42 due to the formation of the inner spacers 50.

In the Y view, the opening 52 causes the removal of fins 26'.

Figure 8:
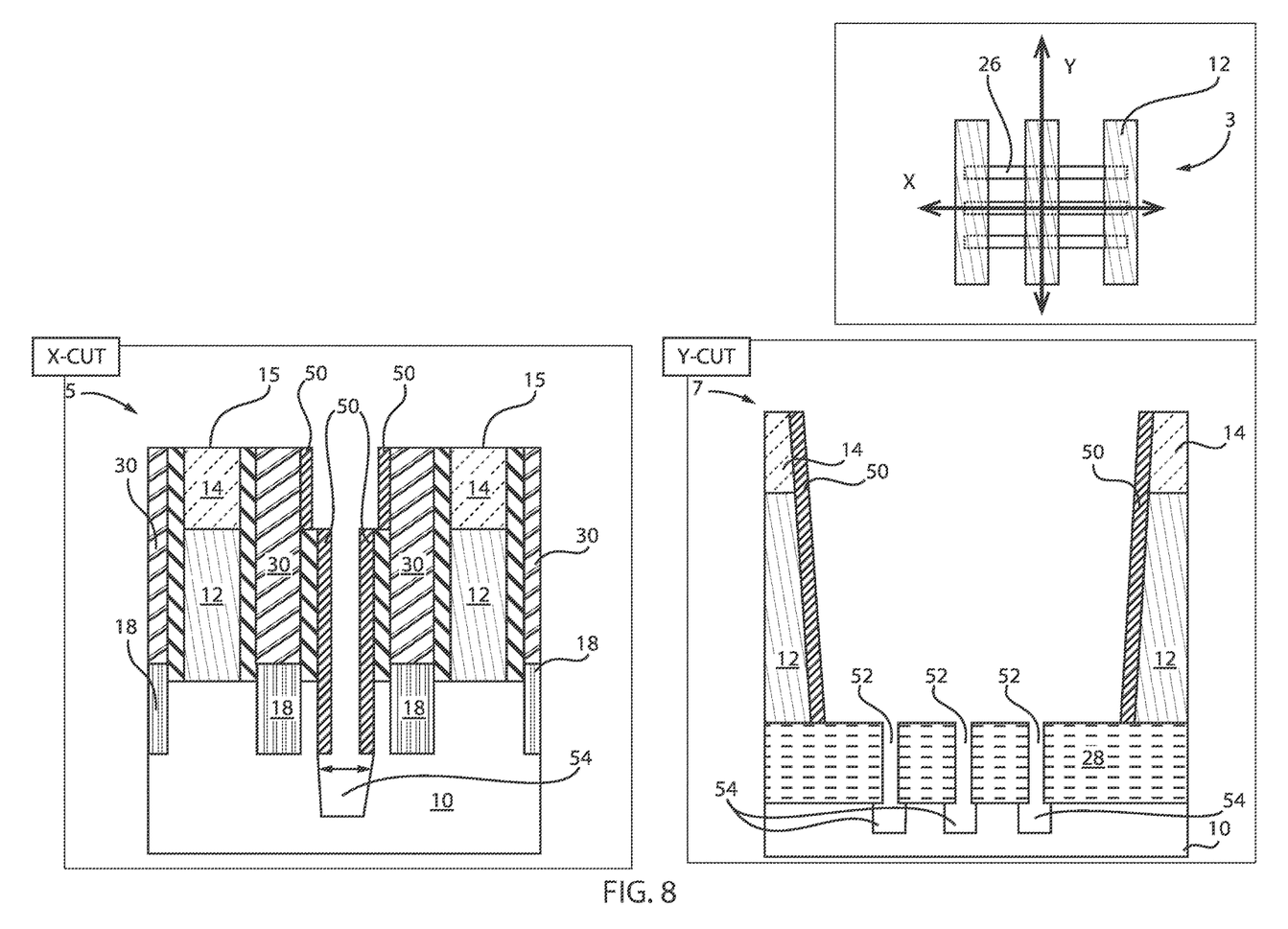
FIG. 8 is a cross-sectional view of the semiconductor structure of FIG. 7 where a third fin recess takes place via an isotropic etch, in accordance with an embodiment of the present invention.

FIG. 8 is a cross-sectional view of the semiconductor structure of FIG. 7 where a third fin recess takes place via an isotropic etch, in accordance with an embodiment of the present invention.

In various example embodiments, a third fin recess takes place via an isotropic etch, thus creating an opening 54. The isotropic etch is performed laterally such that the opening 54 extends under the inner spacers 50. In other words, there is a void or gap in an underlying portion of inner spacers 50.

In the Y view, the openings 52 and 54 are shown. The openings 54 are wider than the openings 52. The openings 54 extend under the STI regions 28.

As the physical gate length (Lg) scales, the width of SDB could become very small, and thus capacitance and leakage concerns can exist. However, the SDB width can be increased to eliminate such issues. The lateral etch enables the expansion or increase of the SDB width before depositing a dielectric fill. The increased SDB width significantly minimizes parasitic capacitance and leakage.

Figure 9:
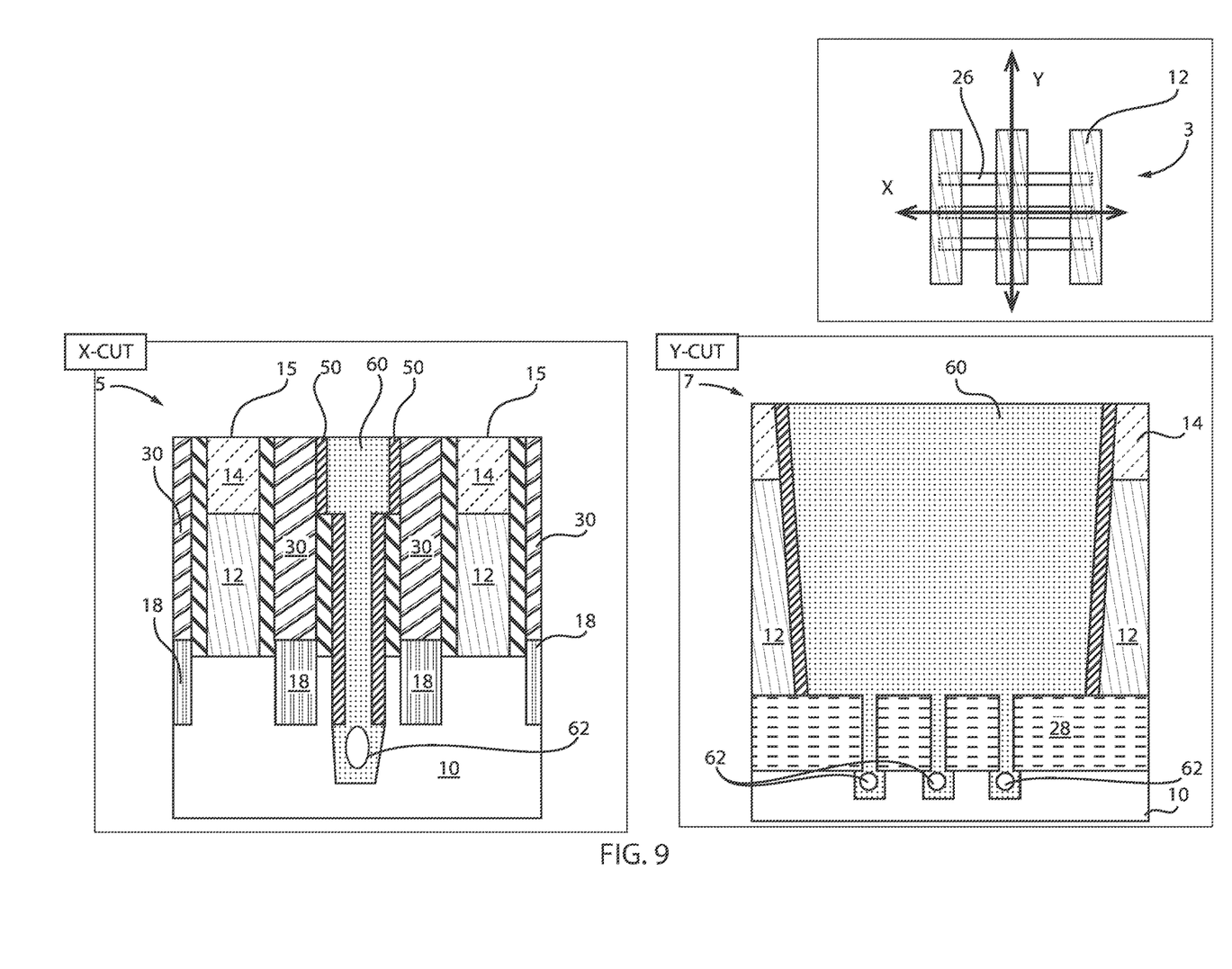
FIG. 9 is a cross-sectional view of the semiconductor structure of FIG. 8 where a dielectric fill takes place such that an air gap is formed to further reduce parasitic capacitance, in accordance with an embodiment of the present invention.

FIG. 9 is a cross-sectional view of the semiconductor structure of FIG. 8 where a dielectric fill takes place such that an airgap is formed to further reduce parasitic capacitance, in accordance with an embodiment of the present invention.

In various example embodiments, a dielectric fill 60 takes place and an air gap 62 is formed in the region where the opening 54 is defined. The air gap 62 helps in further reducing the parasitic capacitance.

The dielectric fill material 60 can be composed of, for example, a flowable oxide or other similar material that is capable of providing electrical isolation between active devices.

The dielectric fill material 60 can be planarized down using such methods as chemical-mechanical polishing (CMP).

Figure 10:
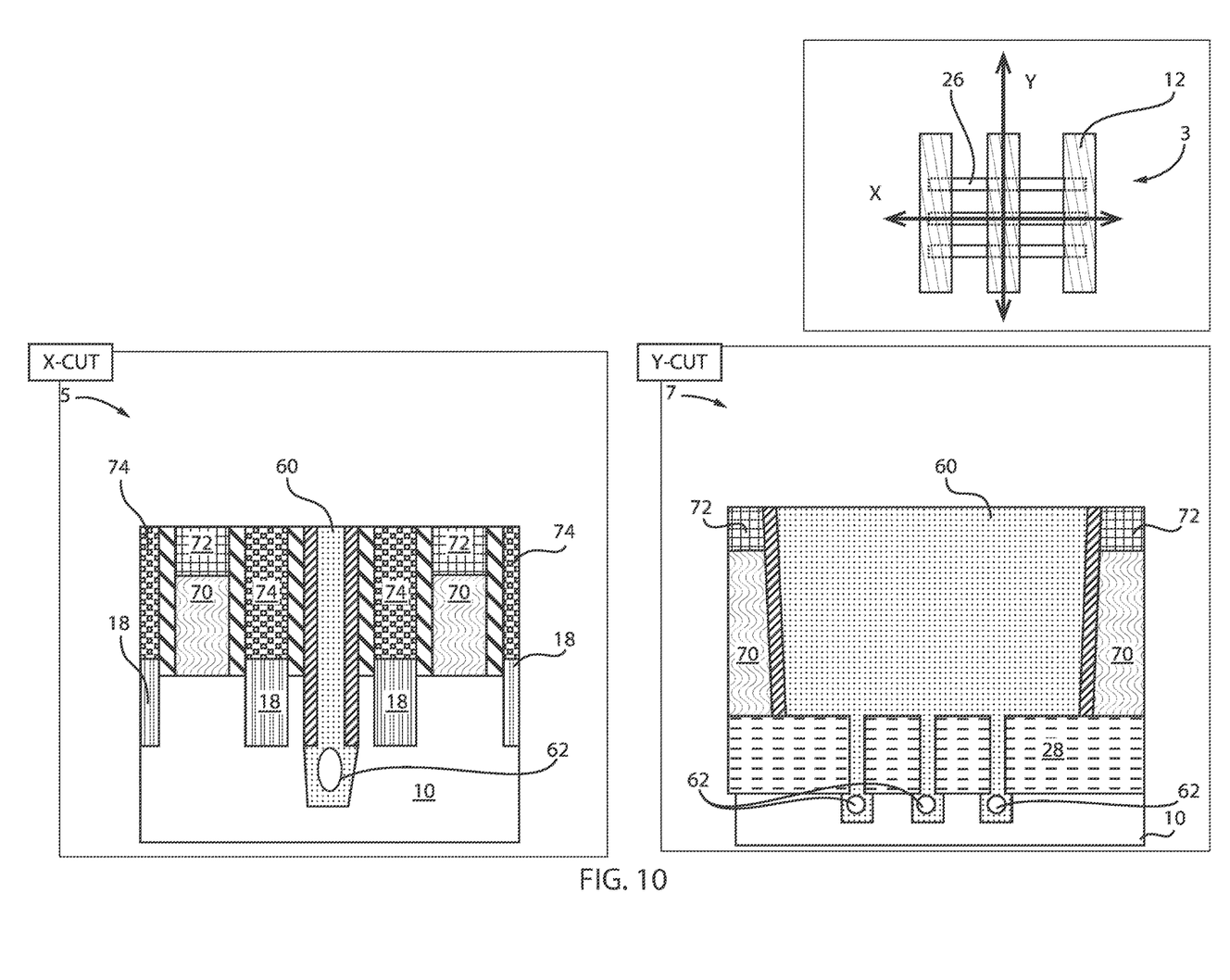
FIG. 10 is a cross-sectional view of the semiconductor structure of FIG. 9 where metallization takes place, in accordance with an embodiment of the present invention.

FIG. 10 is a cross-sectional view of the semiconductor structure of FIG. 9 where metallization takes place, in accordance with an embodiment of the present invention.

In various example embodiments, the dummy fins 12 are removed and a high-k metal gate (HKMG) 70 is formed therein between the spacers 16. A sacrificial cap 72 can be deposited over the HKMG 70. Metallization 74 can also take place over the epitaxial growth regions 18.

In various embodiments, the HKMG 70 can include but is not limited to work function metals such as titanium nitride, titanium carbide, titanium aluminum carbide, tantalum nitride and tantalum carbide; conducting metals such as tungsten, aluminum and copper; and oxides such as silicon dioxide (SiO$_2$), hafnium oxide (e.g., HfO$_2$), hafnium silicon oxide (e.g., HfSiO$_4$), hafnium silicon oxynitride (Hf$_w$Si$_x$O$_y$N$_z$), lanthanum oxide (e.g., La$_2$O$_3$), lanthanum aluminum oxide (e.g., LaAlO$_3$), zirconium oxide (e.g., ZrO$_2$), zirconium silicon oxide (e.g., ZrSiO$_4$), zirconium silicon oxynitride (Zr$_w$Si$_x$O$_y$N$_z$), tantalum oxide (e.g., TaO$_2$, Ta$_2$O$_5$), titanium oxide (e.g., TiO$_2$), barium strontium titanium oxide (e.g., BaTiO$_3$—SrTiO$_3$), barium titanium oxide (e.g., BaTiO$_3$), strontium titanium oxide (e.g., SrTiO$_3$), yttrium oxide (e.g., Y$_2$O$_3$), aluminum oxide (e.g., Al$_2$O$_3$), lead scandium tantalum oxide (Pb(Sc$_x$Ta$_{1-x}$)O$_3$), and lead zinc niobate (e.g., PbZn$_{1/3}$Nb$_{2/3}$O$_3$).

In various exemplary embodiments, metallization includes depositing conductive material 74. The conductive material 74 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The conductive material 64 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In summary, the exemplary embodiments of the present invention pertain to a method and structure of employing an inner spacer during single diffusion break (SDB) formation, such that the source and drain epitaxial regions are protected during Si fin etch. This is significant as the physical gate length (Lg) scales smaller in order to prevent high parasitic capacitance or leakage currents. Moreover, an additional isotropic etch of Si is performed to increase the width of the SDB. If the adjacent epitaxial regions are not protected they will be damaged during this etch process.

Stated differently, source and drain epi is grown between dummy gates, ILD is deposited over the source and drain epi, OPL and SiARC are deposited for SDB patterning, the hardmask (HM) is opened and dummy gate removal in SDB region takes place, anisotropic fin recess is performed (little lateral erosion, therefore no damage to epi), OPL recess is performed and inner spacer formation takes place. The inner spacer can be any material that is selective to the Si etch, e.g. SiC, SiOC, SiOCN, SICO, SiO$_2$ etc. Then, a deep Si selective etch takes place, and the inner spacer prevents lateral erosion and damage to the epi. Subsequently, an additional isotropic Si etch takes place to increase SDB width and to prevent capacitance and leakage concerns. Dielectric fill in SDB is then performed and an airgap in the SDB is formed or defined in order to further reduce parasitic capacitance.

Regarding FIGS. 1-10, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for source and drain epitaxial growth protective inner spacers constructed during single diffusion break formation (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming single diffusion break (SDB) without damaging source and drain epitaxial growth regions, the method comprising:
   forming the source and drain epitaxial growth regions between sacrificial gates, the sacrificial gates formed over a plurality of fins, wherein a top surface of the source and drain epitaxial growth regions extends above a bottom surface of the sacrificial gates;
   depositing an interlayer dielectric (ILD) over the source and drain epitaxial growth regions;
   performing SDB patterning;
   removing at least one of the sacrificial gates to expose the plurality of fins such that top surfaces of shallow trench isolation (STI) regions are exposed, the STI regions formed between the plurality of fins;
   recessing the plurality of fins in a first etch process to create a first opening, the recessing resulting in remaining fin portions, and the first etch process completed once the top surfaces of the STI regions are reached;
   forming inner spacers within the first opening;
   removing the remaining fin portions in a second etch process to create a second opening, dimensions of the second opening defined by the inner spacers, the second etch process completed once bottom surfaces of the STI regions are reached; and
   laterally etching the second opening in a third etch process to increase SDB width.

2. The method of claim 1, wherein the SDB patterning involves employing an organic planarization layer (OPL) and an anti-reflective coating (ARC) layer.

3. The method of claim 1, wherein the inner spacers are constructed from at least one of the following: SiC, SiOC, SiOCN, SiCO, SiO$_2$.

4. The method of claim 1, wherein the lateral etch is an isotropic etch.

5. The method of claim 1, further comprising performing a dielectric fill in the SDB.

6. The method of claim 5, wherein the dielectric fill directly contacts the inner spacers.

7. The method of claim 5, wherein the dielectric fill creates an air gap in a region defined by the second opening.

8. The method of claim 1, wherein creation of the first opening defines substrate portions that protect the source and drain epitaxial growth regions.

9. The method of claim 8, wherein the inner spacers directly contact the substrate portions.

10. A method for forming single diffusion break (SDB) without damaging source and drain epitaxial growth regions, the method comprising:
    forming the source and drain epitaxial growth regions between sacrificial gates, the sacrificial gates formed over a plurality of fins, wherein a top surface of the source and drain epitaxial growth regions extends above a bottom surface of the sacrificial gates;
    performing SDB patterning;
    removing at least one of the sacrificial gates to expose the plurality of fins such that top surfaces of shallow trench isolation (STI) regions are exposed, the STI regions formed between the plurality of fins;
    anisotropically etching the plurality of fins to create a first opening in a first etch process, the anisotropic etching resulting in remaining fin portions, and the first etch process completed once the top surfaces of the STI regions are reached;
    forming inner spacers within the first opening;
    removing the remaining fin portions to create a second opening in a second etch process, the second etch process completed once bottom surfaces of the STI regions are reached; and
    isotropically etching the second opening in a third etch process in a lateral direction with respect to the source and drain epitaxial growth regions to increase SDB width.

11. The method of claim 10, further comprising depositing an interlayer dielectric (ILD) over the source and drain epitaxial growth regions before SDB patterning.

12. The method of claim 10, further comprising performing a dielectric fill in the SDB.

13. The method of claim 12, wherein the dielectric fill directly contacts the inner spacers.

14. The method of claim 12, wherein the dielectric fill creates an air gap in a region defined by the second opening.

15. The method of claim 10, wherein the SDB patterning involves employing an organic planarization layer (OPL) and an anti-reflective coating (ARC) layer.

16. The method of claim 10, wherein the inner spacers are constructed from at least one of the following: SiC, SiOC, SiOCN, SiCO, SiO$_2$.

17. The method of claim 10, wherein creation of the first opening defines substrate portions that protect the source and drain epitaxial growth regions.

18. A semiconductor structure for forming single diffusion break (SDB) without damaging source and drain epitaxial growth regions, the semiconductor structure comprising:
    the source and drain epitaxial growth regions disposed in direct contact with a substrate, wherein a top surface of the source and drain epitaxial growth regions extends above a bottom surface of sacrificial gates;
    a conductive material disposed over the source and drain epitaxial regions;
    inner spacers disposed between source and drain epitaxial regions;
    a dielectric material disposed between the inner spacers and disposed between STI regions, the STI regions disposed between the substrate and the inner spacers, and at least one of the STI regions directly contacting a bottom surface of the inner spacers; and an air gap defined within a distal end of the dielectric material.

19. The semiconductor structure of claim 18, wherein the inner spacers are separated from the air gap by the dielectric material.

20. The semiconductor structure of claim 18, wherein the inner spacers protect the source and drain epitaxial growth regions during SDB formation.

\* \* \* \* \*